US010405463B2

United States Patent
Rosales et al.

(10) Patent No.: US 10,405,463 B2
(45) Date of Patent: Sep. 3, 2019

(54) MULTI-ROTOR AERIAL DRONE WITH VAPOR CHAMBER

(71) Applicant: QUALCOMM Incorporated, San Diego, CA (US)

(72) Inventors: Jorge Rosales, San Diego, CA (US); Victor Chiriac, Phoenix, AZ (US); Jose Gilberto Corleto Mena, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/625,129

(22) Filed: Jun. 16, 2017

(65) Prior Publication Data
US 2018/0368290 A1  Dec. 20, 2018

(51) Int. Cl.
*H05K 7/20* (2006.01)
*B64C 39/02* (2006.01)
*F28D 15/02* (2006.01)
*H05K 1/02* (2006.01)

(52) U.S. Cl.
CPC ....... *H05K 7/20881* (2013.01); *B64C 39/024* (2013.01); *F28D 15/0233* (2013.01); *H05K 1/0203* (2013.01); *B64C 2201/027* (2013.01); *B64C 2201/127* (2013.01)

(58) Field of Classification Search
CPC ............ B64C 2201/042; B64D 13/006; H01L 23/427; H01L 23/473; H05K 7/20336; F28D 15/02; F28D 15/06; F28D 2021/0028
See application file for complete search history.

(56) References Cited

U.S. PATENT DOCUMENTS 6,058,012 A  *  5/2000  Cooper ................... G06F 1/203
                                                        165/80.3
8,123,460 B2     2/2012  Collette et al.
                (Continued)

FOREIGN PATENT DOCUMENTS

| EP | 2147859 A2 | 1/2010 |
| EP | 2930587 A1 | 10/2015 |
| WO | 2016178008 A1 | 11/2016 |

OTHER PUBLICATIONS

International Search Report and Written Opinion—PCT/US2018/034942—ISA/EPO—dated Aug. 7, 2018.

*Primary Examiner* — Joseph W Sanderson
(74) *Attorney, Agent, or Firm* — Loza & Loza, LLP/Qualcomm

(57) ABSTRACT

A quad-rotor or other unmanned aerial drone having a planar vapor chamber mounted to a processor of the drone to cool the processor. The processor may be enclosed in a protective central housing. The vapor chamber is mounted, in some examples, with a perimeter of the vapor chamber extending from the processor through the housing into an airflow region near the rotors of the drone so that airflow, which may include propeller wash, serves to cool the perimeter of the vapor chamber. The planar vapor chamber cools the enclosed processor using both phase-change cooling/heat spreading (i.e. heat is dissipated from the processor via evaporation and subsequent condensation) and convection (i.e. airflow passing over the perimeter of the vapor chamber carries heat away).

18 Claims, 17 Drawing Sheets

(56) References Cited

U.S. PATENT DOCUMENTS

| | | | |
|---|---|---|---|
| 8,985,517 B2* | 3/2015 | Ehinger | B64C 27/12 |
| | | | 244/134 R |
| 2002/0062648 A1* | 5/2002 | Ghoshal | F28D 15/0233 |
| | | | 62/3.7 |
| 2009/0290305 A1* | 11/2009 | Yang | H01L 23/467 |
| | | | 361/690 |
| 2013/0047435 A1* | 2/2013 | Ofoma | H05K 7/20509 |
| | | | 29/890.03 |
| 2014/0220873 A1 | 8/2014 | Bleechmore et al. | |
| 2014/0262161 A1* | 9/2014 | Weigand | G06F 1/203 |
| | | | 165/104.33 |
| 2015/0068703 A1 | 3/2015 | De Bock et al. | |
| 2015/0289413 A1* | 10/2015 | Rush | H05K 7/20672 |
| | | | 361/700 |
| 2016/0137304 A1* | 5/2016 | Phan | B64D 27/02 |
| | | | 244/17.23 |
| 2016/0144954 A1 | 5/2016 | Daigle | |
| 2016/0194069 A1* | 7/2016 | Taylor | B64C 39/024 |
| | | | 244/17.23 |
| 2016/0272316 A1* | 9/2016 | Nelson | B64C 39/024 |
| 2017/0043870 A1 | 2/2017 | Wu et al. | |
| 2017/0225796 A1* | 8/2017 | Sun | B64D 33/08 |
| 2017/0313417 A1* | 11/2017 | Chen | B64C 39/024 |
| 2017/0327233 A1* | 11/2017 | Avignon | B64D 13/006 |
| 2018/0002023 A1* | 1/2018 | Tian | B64D 13/006 |
| 2018/0072431 A1* | 3/2018 | Sahu | B64D 33/08 |

\* cited by examiner

MULTI-ROTOR AERIAL DRONE WITH VAPOR CHAMBER

BACKGROUND

Field

Various features relate to multi-rotor aerial drones or other unmanned aerial vehicles (UAVs) and to cooling methods and apparatus for use therein.

BACKGROUND

Multi-rotor aerial drones (e.g. quadrotors) are typically controlled by processors that are encapsulated or otherwise shielded within a body of the drone to protect the processor from rain, moisture, dust or other environmental hazards. The encapsulation of the processor can result in considerable heating of the processor due to heat generated by the processor itself or by other components of the drone. Excessive heating may cause the processor to throttle-down in flight in an effort to reduce the heat, resulting in, for example, reduced frame rates or reduced resolution of video captured by a drone video camera controlled by the processor, or other reductions in overall performance. If the heating of the processor is severe, the processor may shut down in flight. Overheating of the processor can also be hazardous to anyone touching the drone after completion of a flight. That is, the skin temperature of the drone can become too high, exceeding skin temperature limits. Current solutions that attempt to address these and other processor overheating problems include providing heat sinks (which can be relatively bulky and heavy) or processor cooling fans (which can be noisy and waste considerable power). In this regard, adding mini-fans or heat sinks to cool drone components leads to solutions that may be limited in efficiency, add costs, increase noise and/or require additional power. Moreover, if the fan fails, permanent damage can occur.

Consequently, there is a need for an efficient and cost effective cooling system for cooling the processor of a drone or other UAV. Ideally, such a cooling system would include components that are thin, light and inexpensive.

SUMMARY

Various features relate to an aerial drone having a planar vapor chamber or to a cooling apparatus having a planar vapor chamber for an aerial drone.

In one example, an aerial drone comprises: one or more rotors; a processor operative to control the aerial drone; and a planar vapor chamber mounted to the processor.

According to one aspect, the planar vapor chamber has a first portion mounted to the processor and a second portion extending from the processor into an airflow region of the aerial drone to cool the processor. The second portion of the planar vapor chamber may extend into the airflow region by an amount sufficient to provide convective cooling of the second portion of the planar vapor chamber during operation of the aerial drone.

According to another aspect, the processor is mounted within a central housing of the aerial drone and a portion of the planar vapor chamber extends through the housing into an airflow region of the aerial drone surrounding the housing.

According to another aspect, the planar vapor chamber is mounted to the processor using a thermal interface material (TIM).

According to another aspect, the planar vapor chamber is an integral device configured to permit a working fluid to flow freely throughout interior portions thereof.

According to another aspect, a first side of the processor is mounted to a printed circuit board and a second side of the processor is mounted to the planar vapor chamber.

According to another aspect, the planar vapor chamber is shaped with legs extending outwardly from a central portion of the planar vapor chamber. The aerial drone may have struts that extend from a central portion of the aerial drone to support the one or more rotors, wherein the legs of the planar vapor chamber extend outwardly from the central portion along the struts. The legs of the planar vapor chamber may be positioned relative to the struts to not significantly interfere with aerodynamics of the aerial drone. In various aspects, the legs may extend along the struts either above, below or within the struts.

According to another aspect, the aerial drone further comprises an on-board electronic system including a video device, a camera device, a navigation device and/or a wireless communication device, and wherein the processor controls the electronic system.

In a second example, a cooling apparatus for an aerial drone having a processor and one or more rotors comprises: planar vapor chamber means for cooling; and mounting means for mounting the planar vapor chamber means to the processor.

According to one aspect, the planar vapor chamber means has a first portion mounted to the processor and a second portion extending from the processor into an airflow region of the aerial drone to cool the processor. The second portion of the planar vapor chamber means may extend into the airflow region by an amount sufficient to provide convective cooling of the second portion of the planar vapor chamber means during operation of the aerial drone.

According to another aspect, the processor is mounted within a central housing of the aerial drone and the planar vapor chamber means extends through the housing into an airflow region of the aerial drone surrounding the housing.

According to another aspect, the mounting means includes a thermal interface material (TIM).

According to another aspect, the planar vapor chamber means is an integral device configured to permit a working fluid to flow freely throughout interior portions thereof.

According to another aspect, a first side of the processor is mounted to a printed circuit board and a second side of the processor is mounted to the planar vapor chamber means.

According to another aspect, the planar vapor chamber means has legs extending outwardly from a central portion of the planar vapor chamber means. The aerial drone may have struts that extend from a central portion of the aerial drone to support the one or more rotors and wherein the legs of the planar vapor chamber means extend outwardly from the central portion along the struts. The legs of the planar vapor chamber means may be positioned relative to the struts to not significantly interfere with aerodynamics of the aerial drone. In various aspects, the legs may extend along the struts either above, below or within the struts.

According to another aspect, the aerial drone includes an electronic system including a video device, a camera device, a navigation device and/or a wireless communication device and wherein the processor controls the electronic system.

In a third example, a method for providing a cooling apparatus for an aerial drone comprises: mounting a planar vapor chamber to a processor with the planar vapor chamber configured to dissipate heat from the processor during use of the processor; and installing the processor and the planar vapor chamber in the aerial drone, with a portion of the planar vapor chamber extending into an airflow region of the aerial drone to cool the processor during use of the aerial drone.

In one aspect, the planar vapor chamber extends into the airflow region of the aerial drone by an amount sufficient to provide convective cooling of a perimeter portion of the planar vapor chamber during operation of the aerial drone. The planar vapor chamber may have legs extending outwardly from a central portion of the planar vapor chamber.

In a fourth example, a method for providing a cooling apparatus for an aerial drone comprises: installing a processor within the aerial drone; and mounting a planar vapor chamber to the processor of the aerial drone, with a portion of the planar vapor chamber extending into an airflow region of the aerial drone to cool the processor during use of the drone.

In one aspect, the planar vapor chamber extends into the airflow region of the aerial drone by an amount sufficient to provide convective cooling of a perimeter portion of the planar vapor chamber during operation of the aerial drone. The planar vapor chamber may have legs extending outwardly from a central portion of the planar vapor chamber.

DRAWINGS

Various features, nature and advantages may become apparent from the detailed description set forth below when taken in conjunction with the drawings in which like reference characters identify correspondingly throughout.

Figure 4:
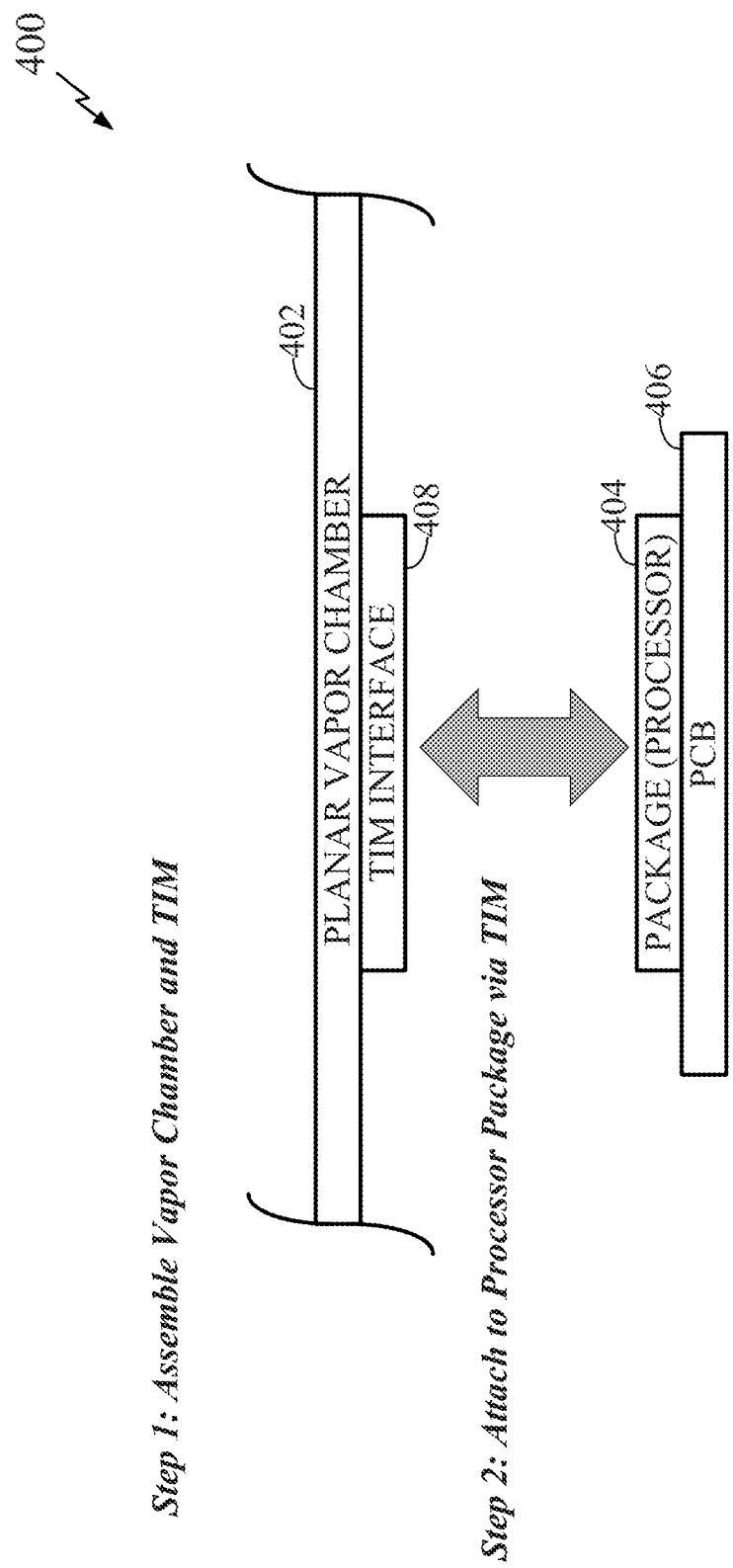

FIG. 4 summarizes an assembly procedure for assembling a processor package with a planar vapor chamber using a thermal interface material (TIM).

Figure 5:
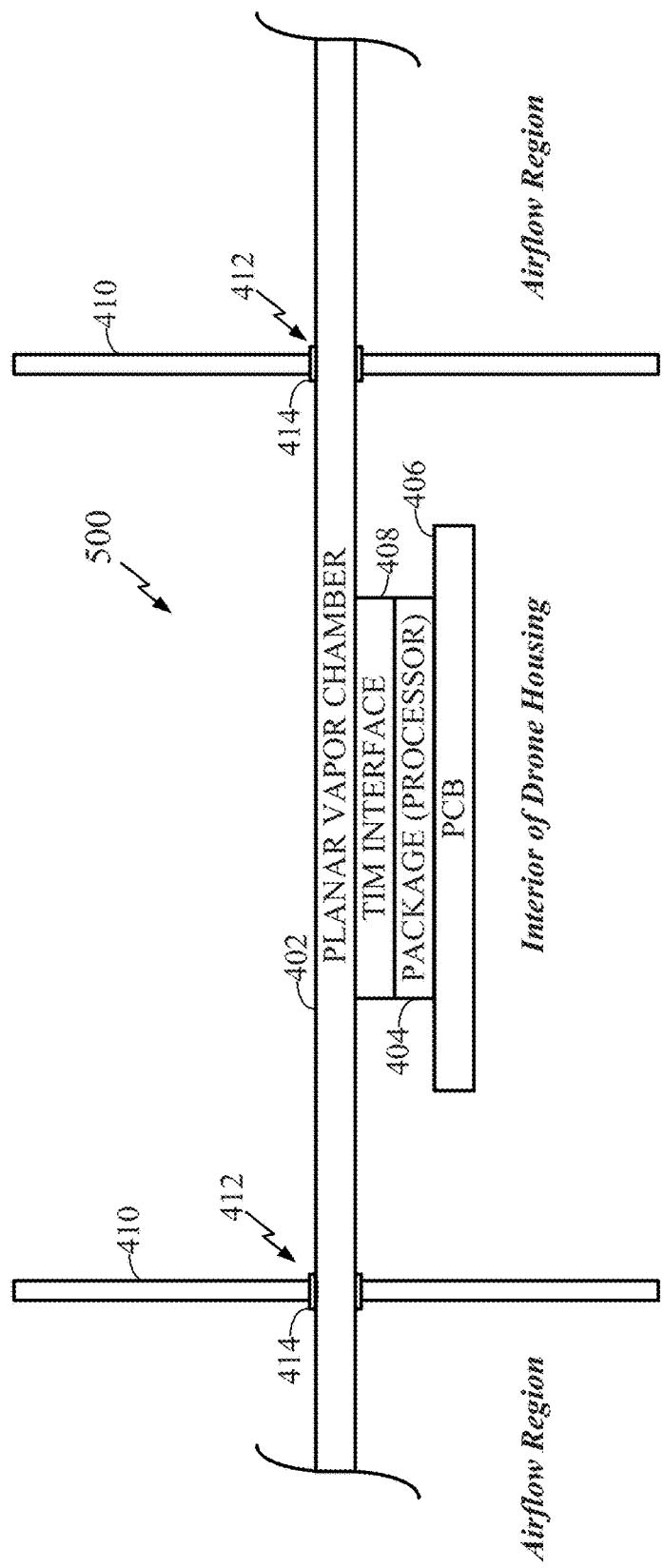

FIG. 5 illustrates the resulting processor package/vapor chamber assembly installed in the central housing of an aerial drone with perimeter portions extending into an airflow region surrounding the housing.

Figure 6:
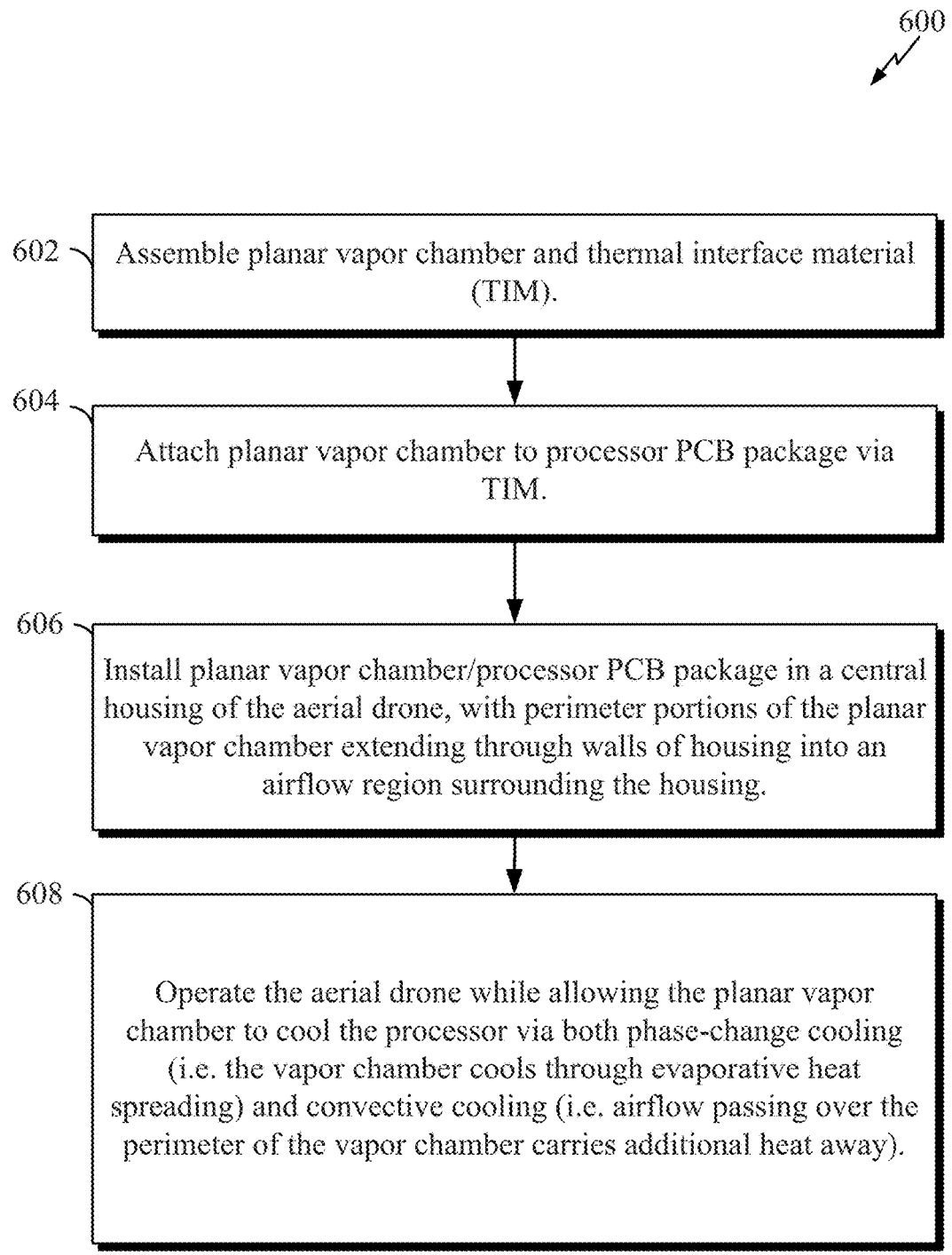

FIG. 6 is a flow diagram summarizing the assembly and use of the vapor chamber processor package of the aerial drone.

Figure 7:
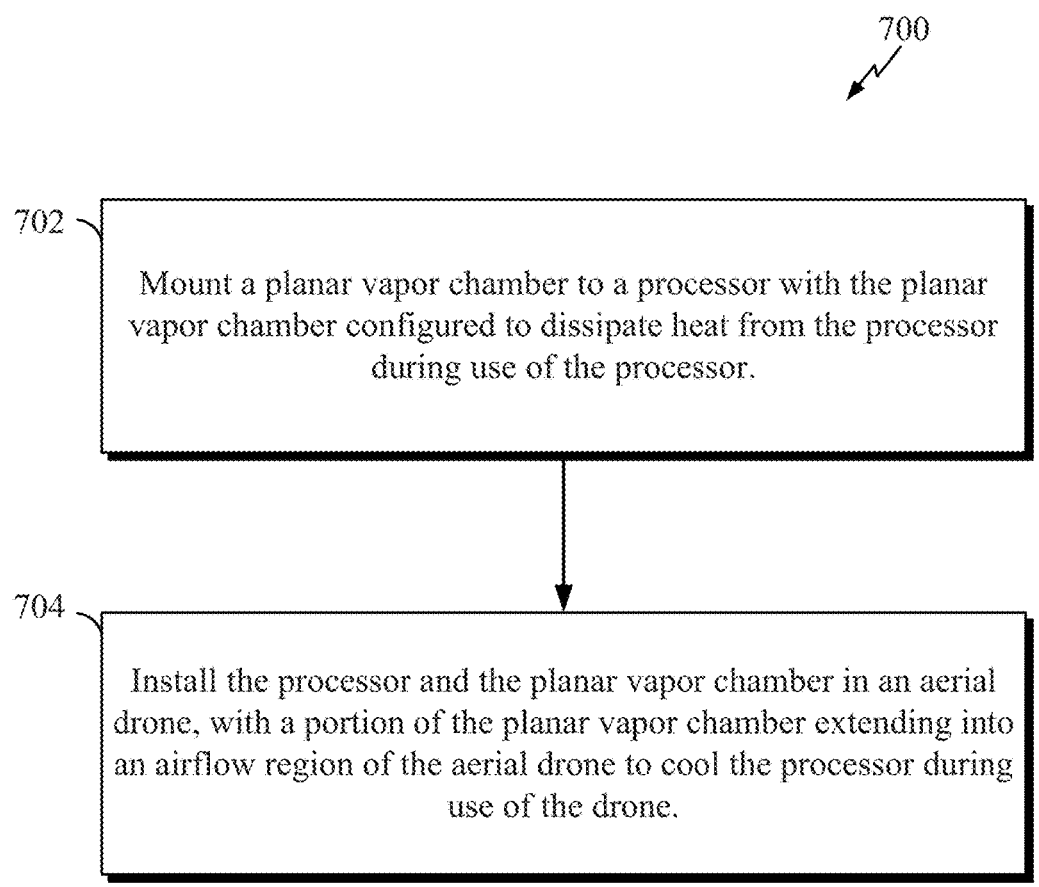

FIG. 7 is a flow diagram summarizing the mounting of the vapor chamber and processor of the aerial drone for examples where the vapor chamber is mounted to the processor before the processor is installed in the drone.

Figure 8:
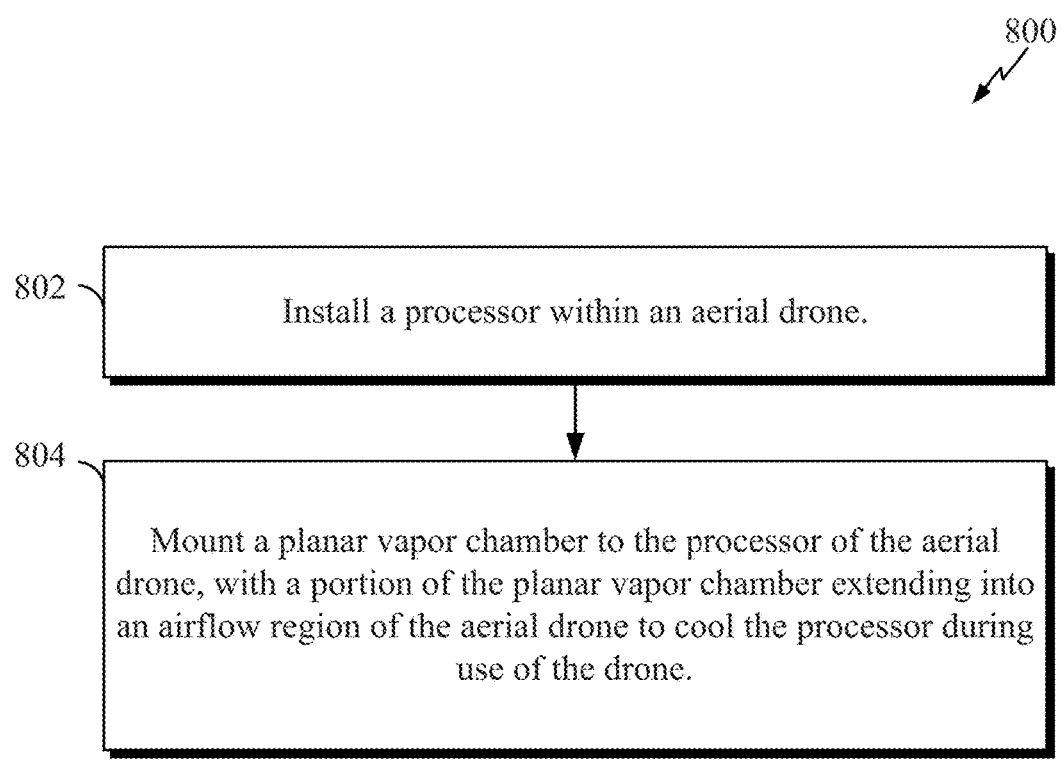

FIG. 8 is a flow diagram summarizing the mounting of the vapor chamber and the processor for examples where the vapor chamber is mounted to the processor after the processor is installed in the drone.

Figure 9:
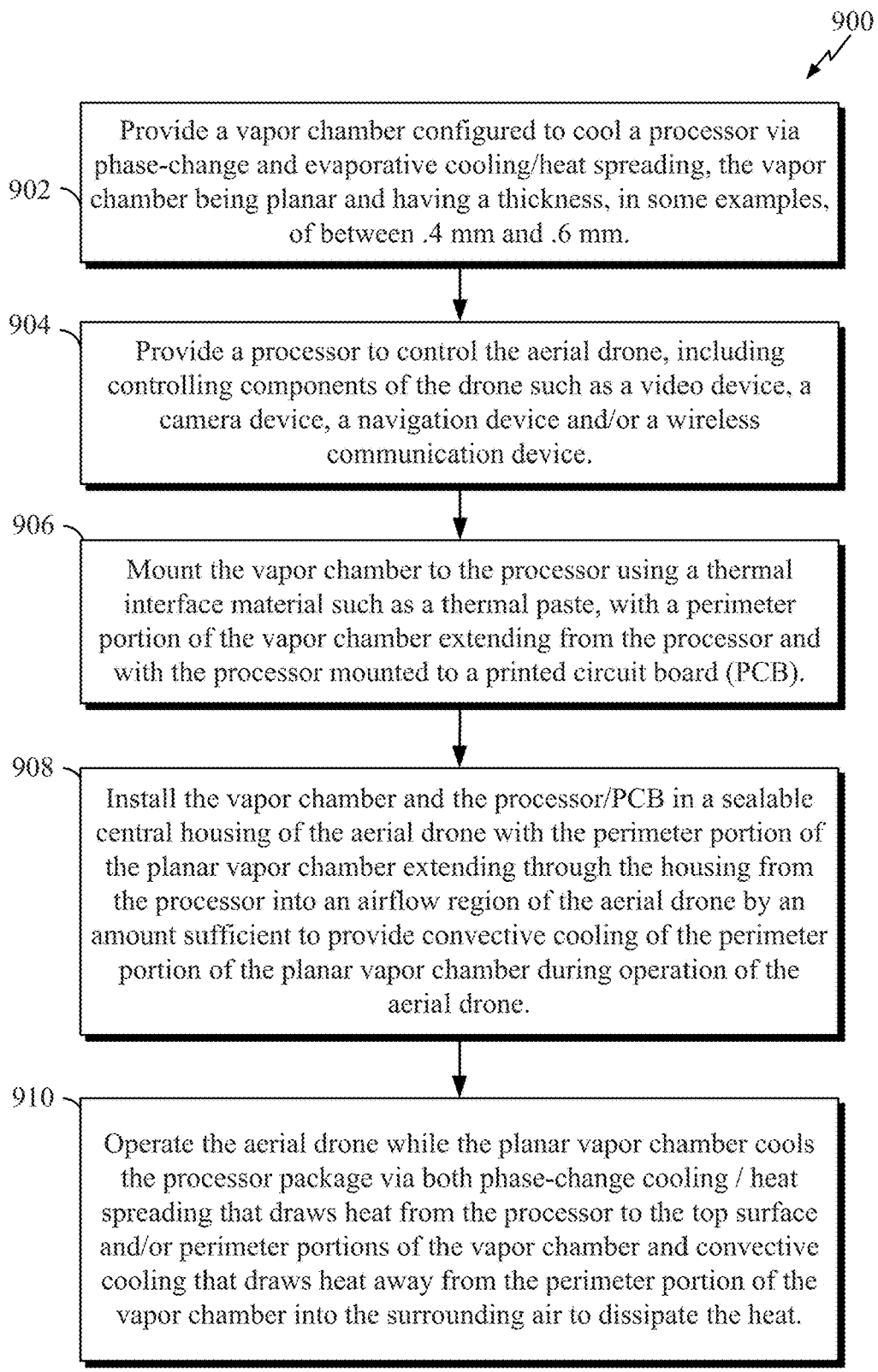

FIG. 9 is a flow diagram illustrating further aspects of the mounting of the vapor chamber and the processor package of the aerial drone and its subsequent use.

Figure 10:
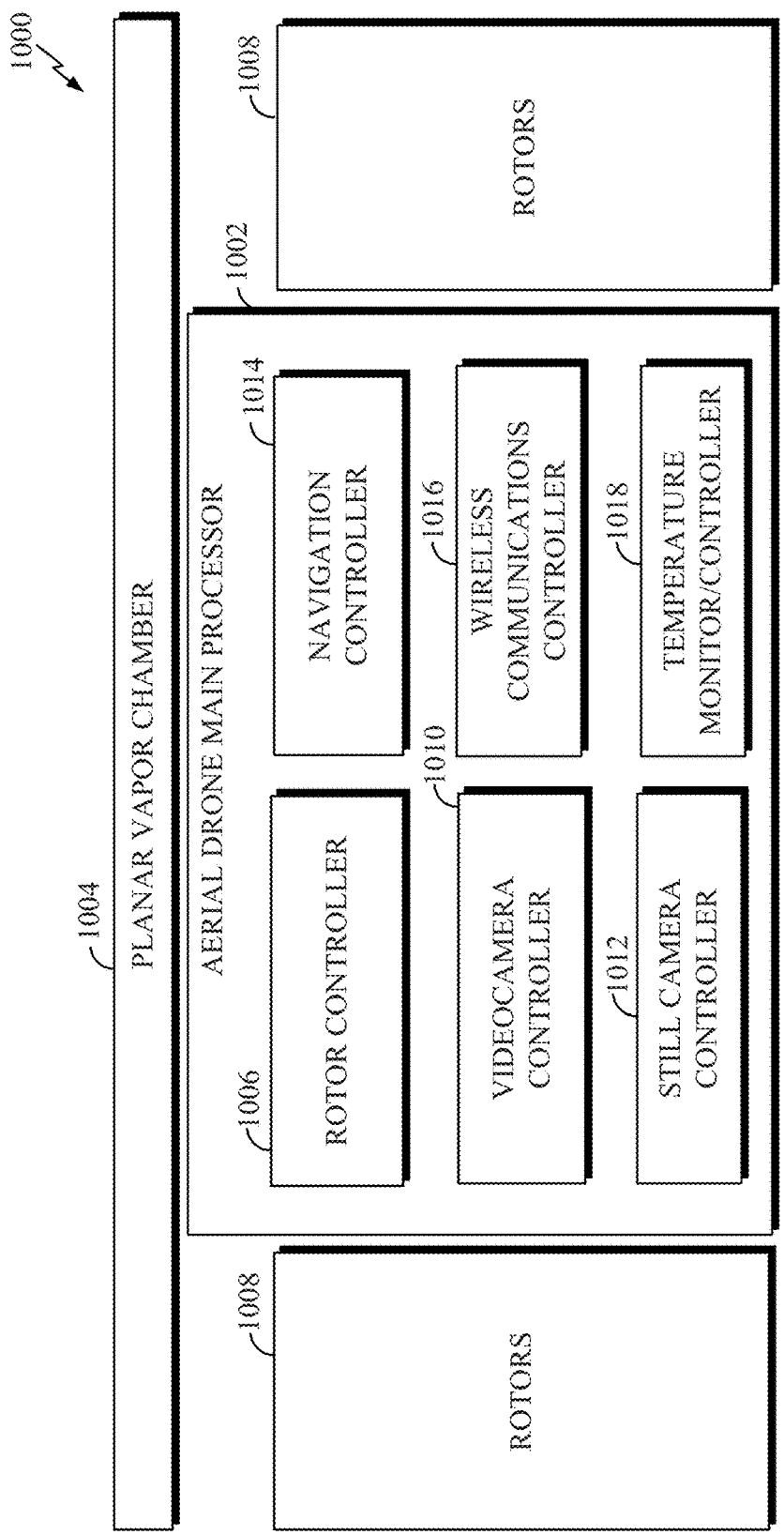

FIG. 10 is a block diagram illustrating various components of the aerial drone.

Figure 11:
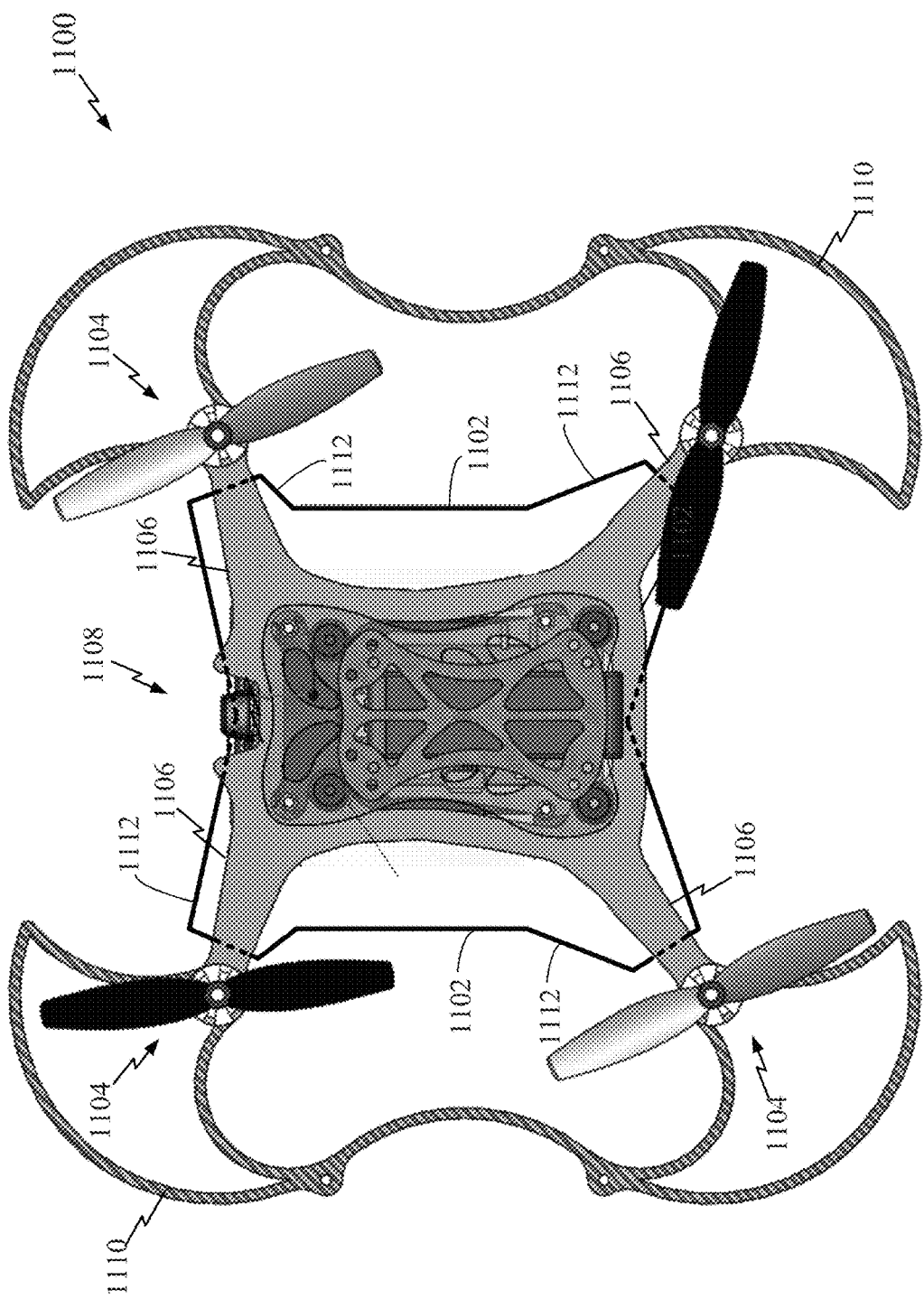

FIG. 11 is a top view of an aerial drone with a turtle-shaped vapor chamber.

Figure 12:
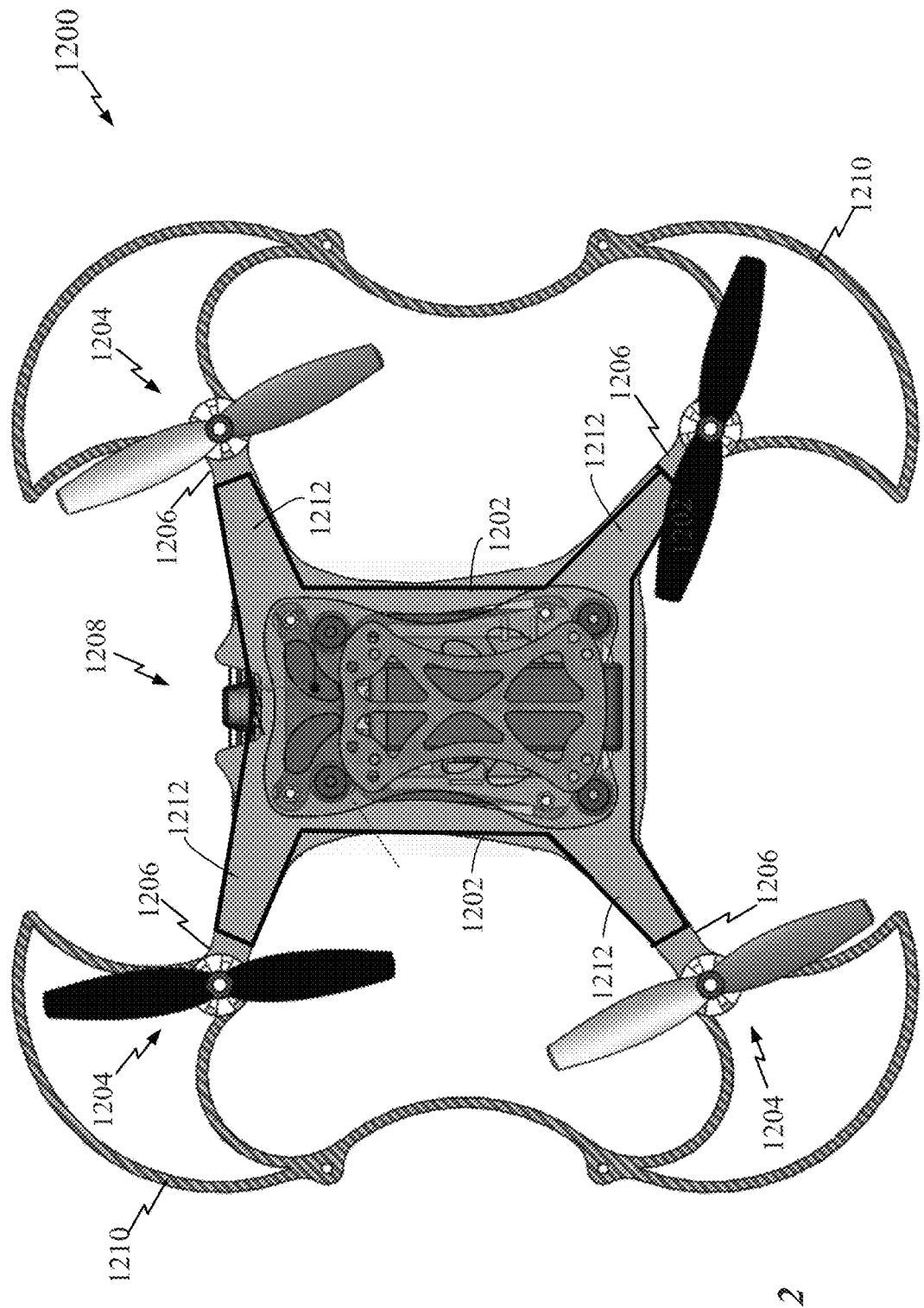

FIG. 12 is a top view of an aerial drone with a smaller turtle-shaped vapor chamber.

Figure 13:
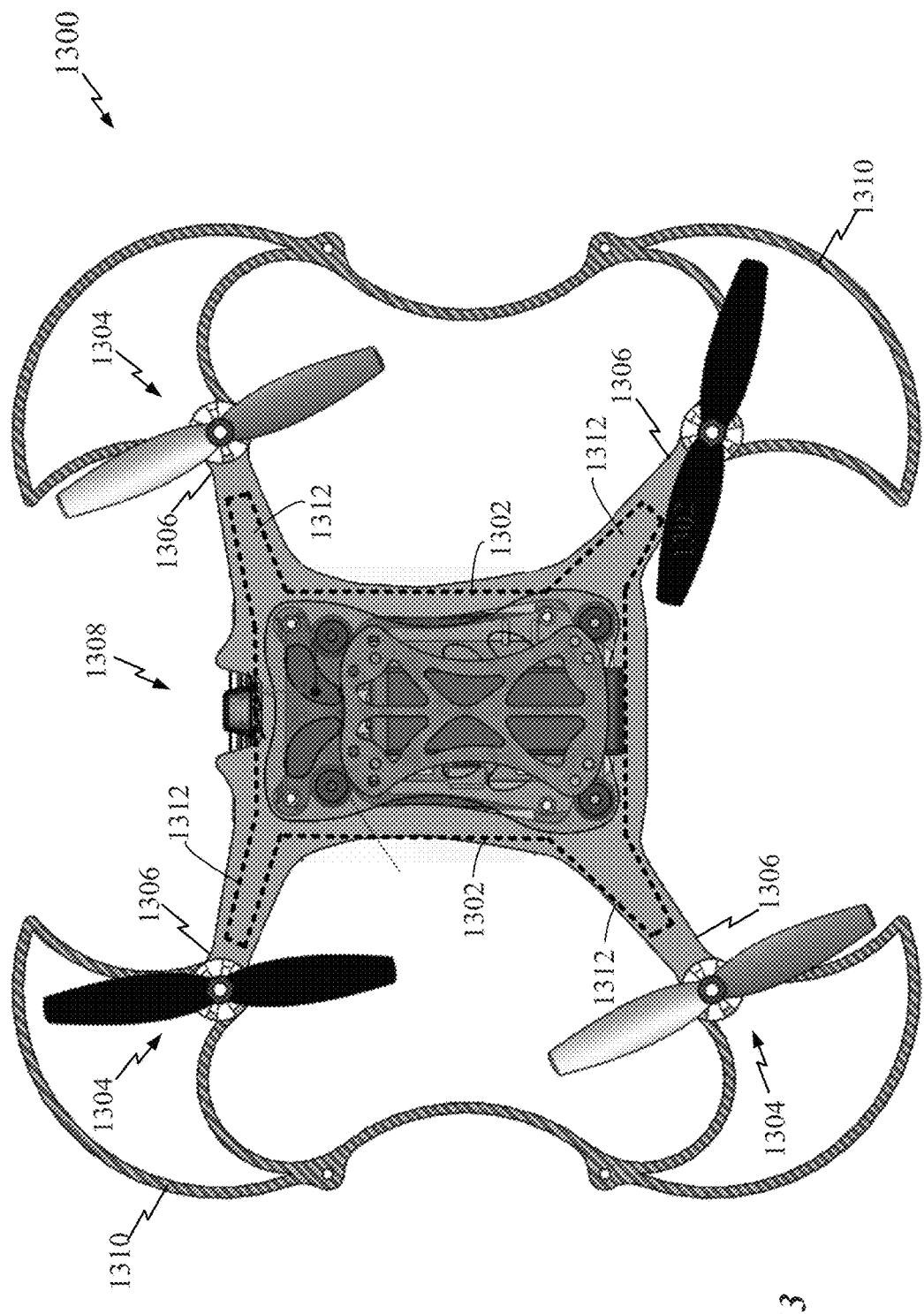

FIG. 13 is a top view of an aerial drone with another, still smaller turtle-shaped vapor chamber.

Figure 14:
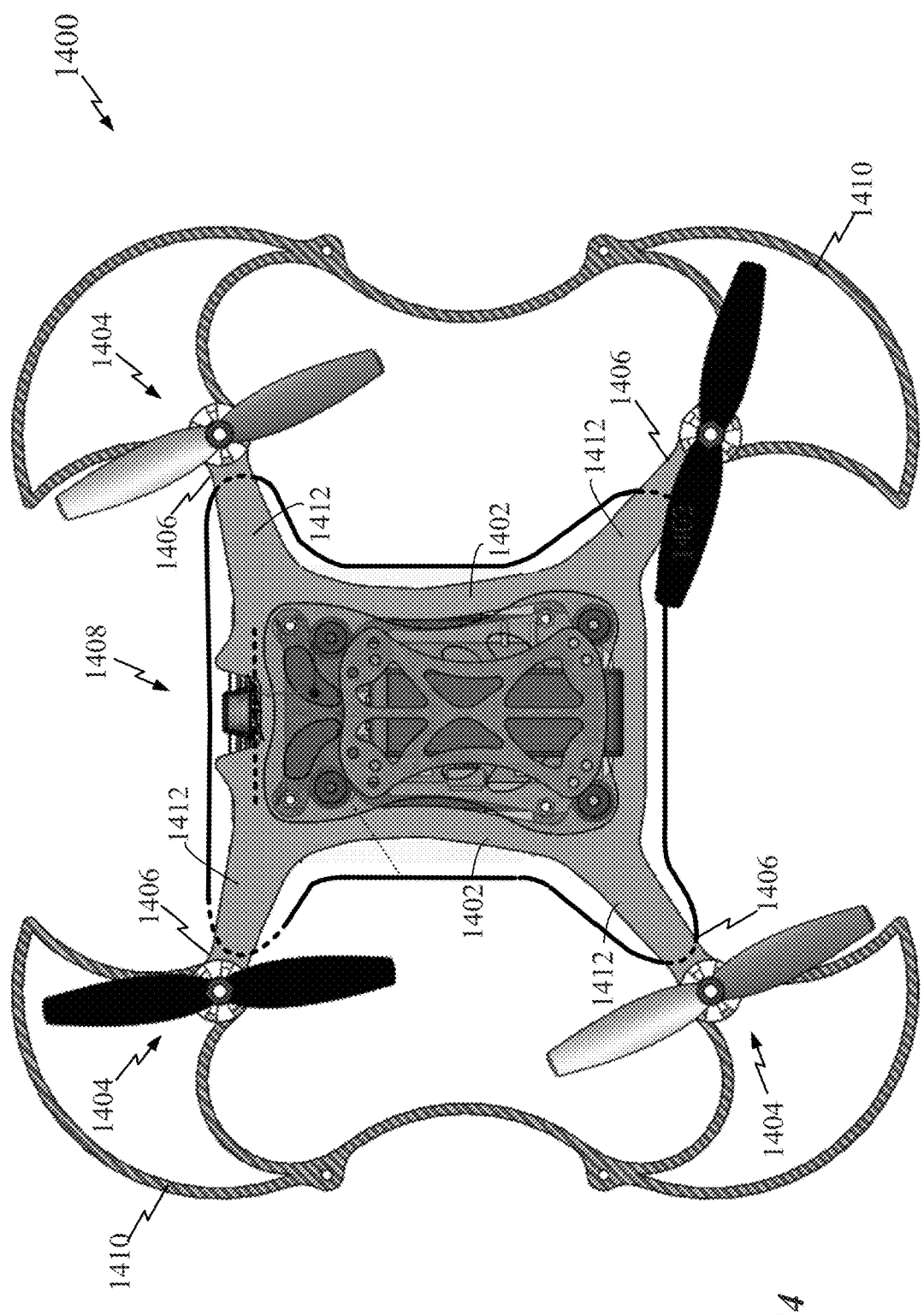

FIG. 14 is a top view of an aerial drone with a turtle-shaped vapor chamber having curved or rounded edges.

Figure 15:
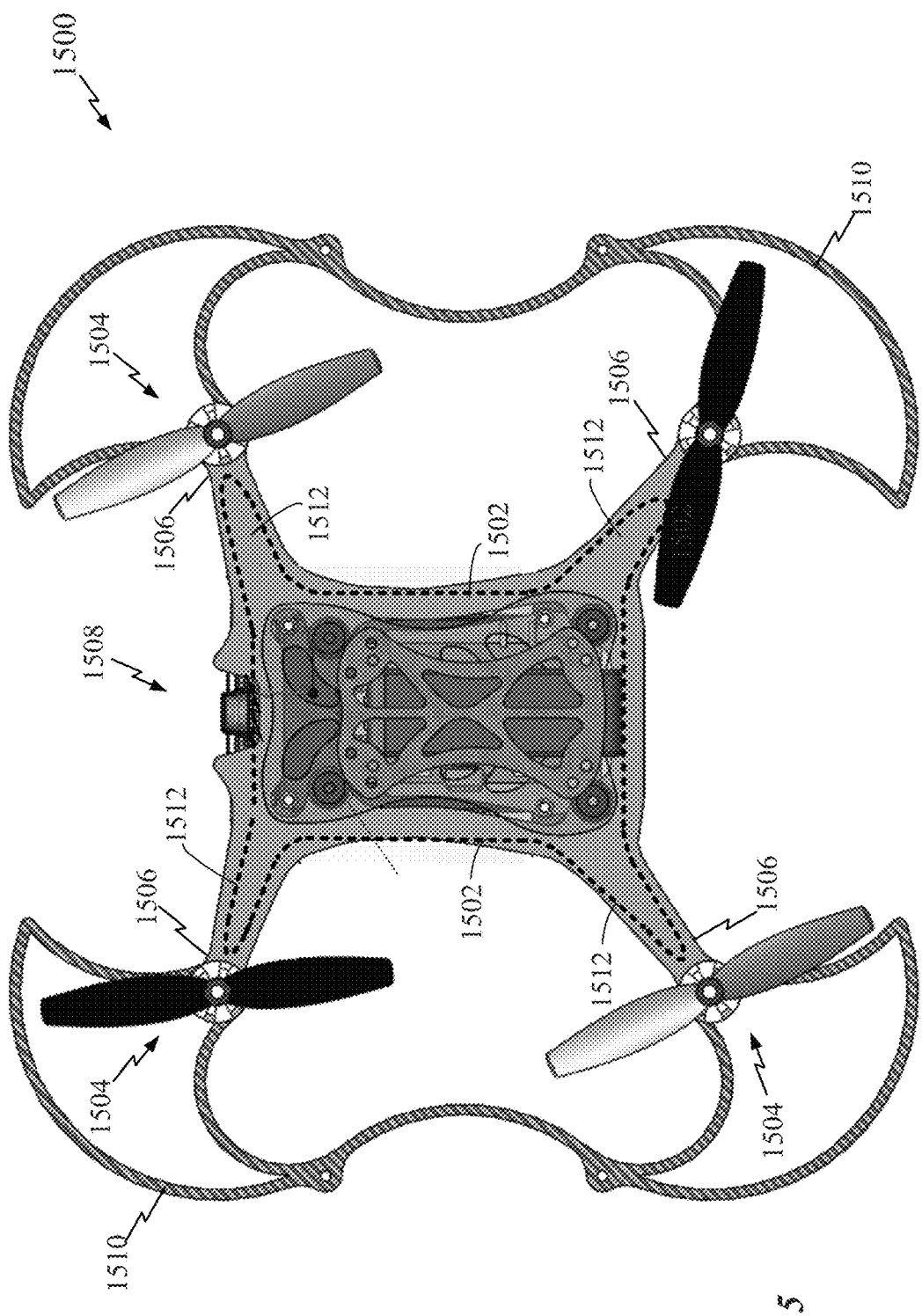

FIG. 15 is a top view of an aerial drone with another, smaller turtle-shaped vapor chamber having curved or rounded edges.

Figure 16:
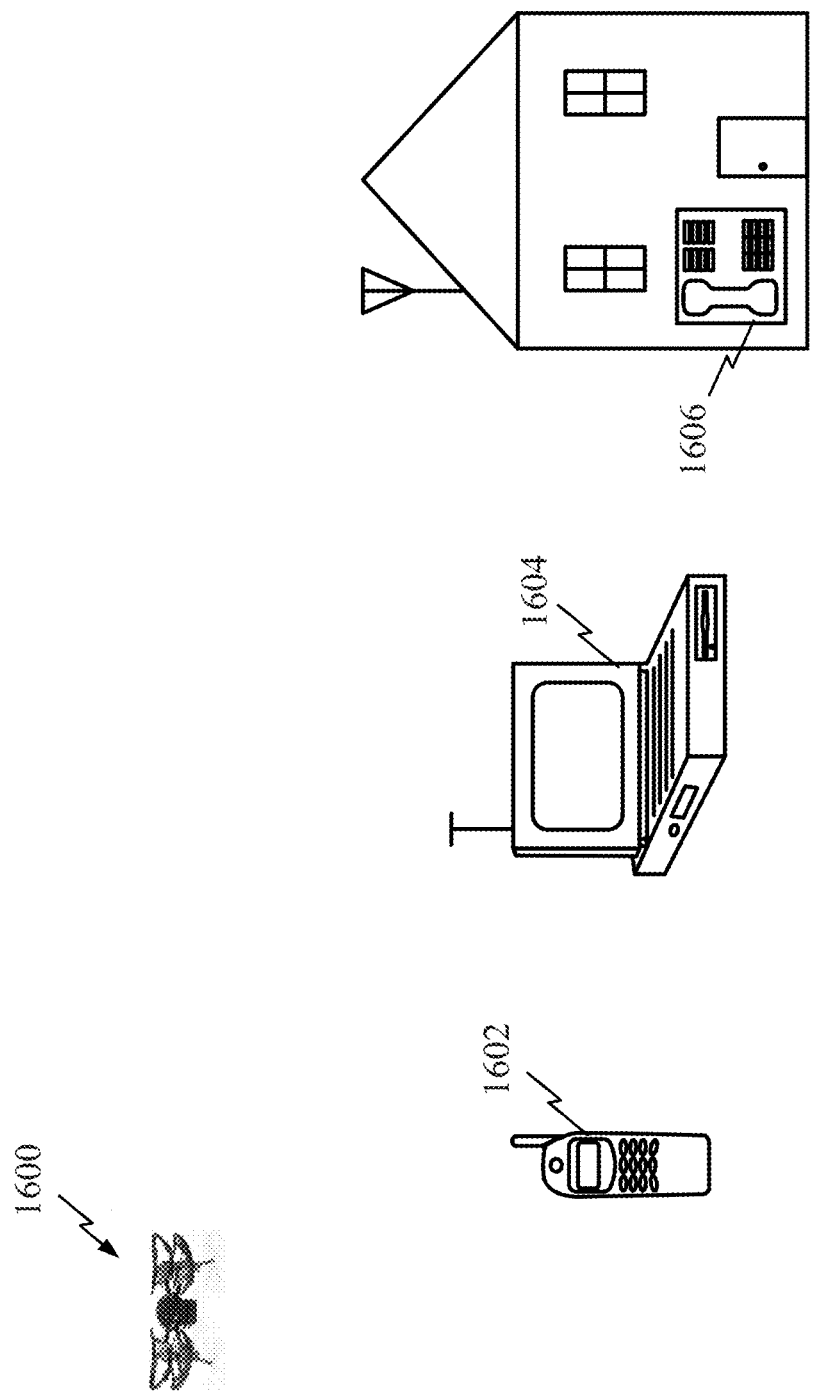

FIG. 16 illustrates various electronic devices that may be used in communication with any of the aforementioned aerial drones.

Figure 17:
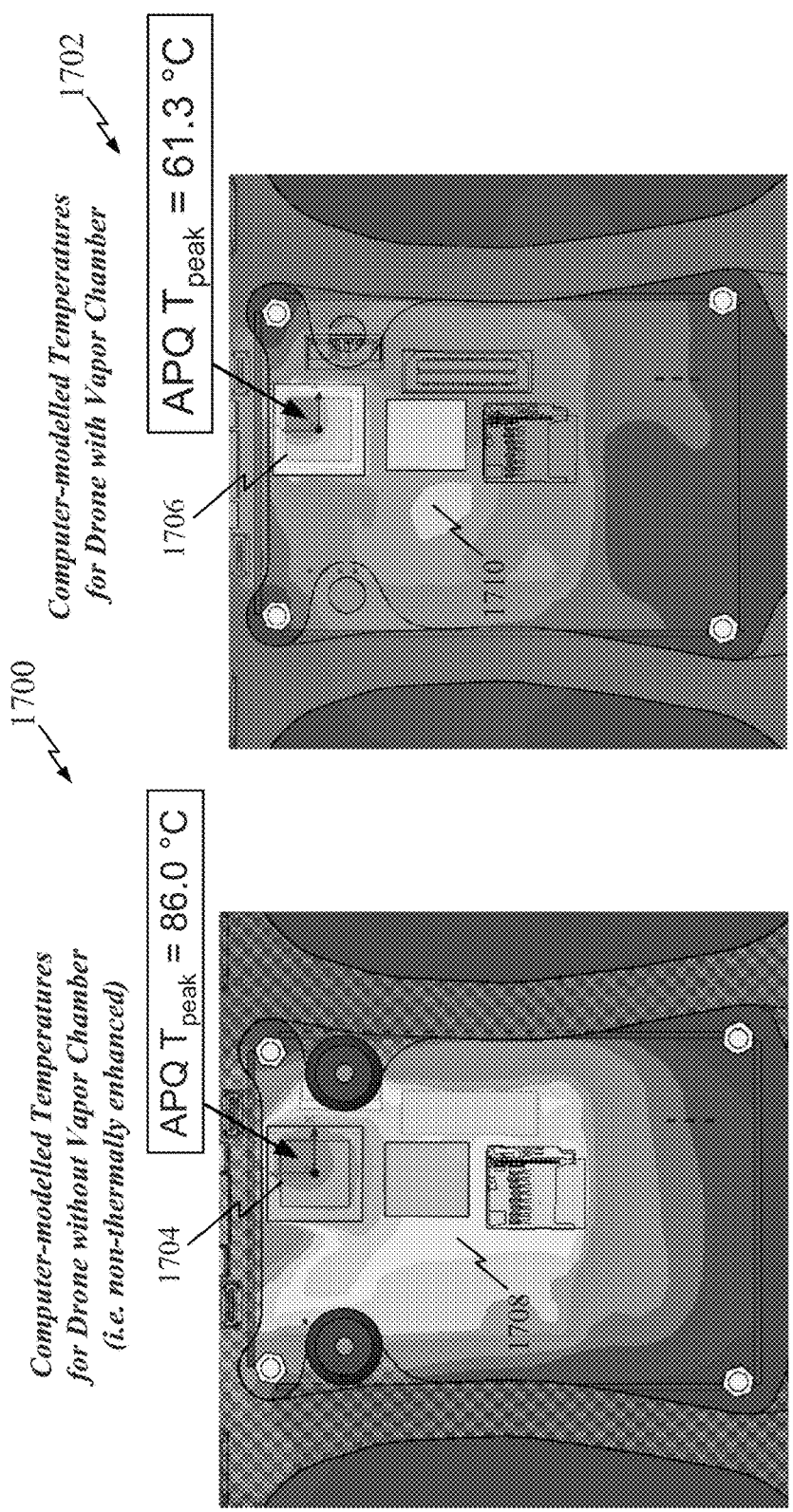

FIG. 17 illustrates computer-modelled temperature results for exemplary aerial drones, particularly showing a comparison of a drone without a vapor chamber (i.e. non-thermally enhanced) and a vapor chamber-cooled drone.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.
Overview Some novel features pertain to an aerial drone having a vapor chamber. In some implementations, the aerial drone has one or more rotors and a processor for controlling the rotor(s). The vapor chamber has a first portion mounted adjacent the processor and a second portion extending away from the processor to cool the processor.

Briefly, in some implementations, a planar vapor chamber or other suitable thin planar vapor-based heat spreader is mounted adjacent the processor of an aerial drone to dissipate heat from the processor. A suitable vapor chamber may include a hermetically sealed vessel, a working fluid such as water, and a closed-loop capillary (wicking) recirculation system. Heat to be dissipated causes the fluid to evaporate (thus providing phase-change evaporative cooling). The resulting vapor travels through internal conduits of the vapor chamber to condenser surfaces of the chamber, where it condenses back to a fluid and is then drawn back toward the heat source, where it again evaporates, thus providing for recirculation cooling. The vapor chamber of the drone is mounted, in some examples, with a perimeter of the vapor chamber extending into an airflow region of the drone so that airflow (which may include propeller "wash") serves to cool the perimeter portions of the vapor chamber. With this design, the vapor chamber cools the processor using both phase-change cooling (i.e. the vapor chamber cools through evaporative heat spreading and then condensing on the condenser surfaces of the vapor chamber) and convection (i.e. airflow passing over the perimeter of the vapor chamber carries additional heat away). It is noted that there may also be some conduction of heat through the walls of the vapor chamber, thus providing for some conduction or conductive cooling, but this is a relatively minor contribution to the overall cooling effect of the vapor chamber.

In some implementations, the vapor chamber has a "turtle" shape designed to match the general shape of the drone (e.g. the vapor chamber is shaped with legs that extend outwardly from a central body along the strut arms of the drone). This design permits the vapor chamber to have a generally larger surface area than might otherwise be accommodated, without unduly affecting the aerodynamic properties of the drone itself. By aligning the legs of the chamber with the struts of the drone, there may be less convective cooling since there will likely be less airflow over the perimeter portions of the vapor chamber. However, the larger overall size of the vapor chamber provides for greater evaporative cooling. The vapor chamber may be, for example, only 0.4 mm to 0.6 mm thick and hence quite light (while also being, e.g., several inches in length and in width). In other examples, the thickness may be greater than 0.6 mm, and it should be understood that no specific restrictions are imposed herein on the size, shape, thickness or weight of the vapor chamber. However, by using a relatively light vapor chamber rather than a heavier heat sink (or a cooling fan) as provided in some aerial drones, the drone itself may be kept lighter to thereby reduce power consumption, improve flight performance and increase overall maximum flight time. Depending upon the particular implementation, the vapor chamber may be a commercial off-the-shelf device (such as vapor chambers provided by Asia Vital Components Co., LTD of Taiwan) or a specialized design with a customized shape. In some examples, two or more vapor chambers may be used. The vapor chamber(s) may be mounted to the processor using a thermal interface material (TIM) such as thermal paste. If the processor is mounted within a sealed body of the drone, the vapor chamber may be mounted to extend laterally through the seal to protrude into the air space around the sealed body to facilitate convective cooling of perimeter portions of the vapor chamber by propeller wash or other airflow.

In this regard, in order to achieve higher computational performance levels, more heat should be dissipated from drone processors to prevent overheating. High energy density can lead to both hot internal drone components and hot external surfaces. The components (i.e. electronic packages) that power and/or control the drones are often encapsulated/enclosed/shielded from incoming water and moisture and lack effective cooling solutions, which can lead to junction temperature violations. That is, commercial drones incorporate/enclose various packaged electronics which can become increasingly hot, violating junction and/or skin limits, thus significantly limiting the drone overall performance and time to flight. As such, the application processor/component junction temperatures should be reduced to achieve higher drone performance and improved time to flight, and also to achieve and maintain reliable and comfortable/safe operation.

In a conventional drone, the application processor/component junction peak temperature ($T_{peak}$) may often reach 86 C.°. However, by using a vapor chamber as described herein, $T_{peak}$ can be reduced, in some examples, to about 61 C.°, yielding a 25 C.° reduction in junction temperature, a significant improvement. Computer-modelled temperatures for exemplary drones are discussed below in greater detail. Skin temperature is preferably limited to 45 C.°-50 C.° when the user is holding the drone in hand. By significantly reducing the junction temperature by employing a vapor chamber, skin temperatures are thus also reduced and more easily kept below the limit of 45 C.°-50 C°.

As such, at least some aspects or features of the aerial drones described herein serve to lower the junction temperature of the encapsulated processor package by selectively spreading the heat over a planar vapor chamber that is cooled by a fraction of the incident air from the propellers. An additional design feature exploits the extension of the vapor chamber sides at its corners, along struts of the drone frame, thus not interfering with the airflow while enhancing the overall thermal performance and flight time of the drone. In examples where the vapor chamber is extended along drone struts, the extensions (i.e. legs or arms) of the vapor chamber may be positioned below the drone frame, above the drone frame or, in some examples, within the struts of the drone frame. If the extensions of the vapor chamber are mounted within the struts, the struts may be provided with openings to permit air to flow past the extensions to facilitate cooling.

To summarize some features of the aerial drones described herein:
- The exemplary aerial drones described herein may use a vapor chamber placed in contact with the hot electronic components encapsulated in a drone.
- The vapor chamber is sized in some examples so that it is relatively wide and thus cooled by the incident propeller airflow which washes the lateral wings (or perimeter portions) of the vapor chamber (i.e. flaps protruding from the drone body/enclosure).
- An additional design exploits a turtle-shaped corner extension for the vapor chamber, which extends along the drone frame to provide a larger surface area for the vapor chamber (~35-40% larger) to contribute to enhanced thermal performance.
- Manufacturing controllability and flexibility can be achieved and/or facilitated by changing or selecting the vapor chamber size, shape and/or location (i.e. placed through the drone body and/or along the drone frame).
- A drone manufacturer can optimize or otherwise enhance the thermal design by adjusting the lateral size of the vapor chamber (for both wide rectangular and turtle-shaped) to minimize or reduce any impact on lift and flight performance.
- Simple methods are available to mass-produce the vapor chambers and to couple the devices to internal drone components and further below the drone frame.

Exemplary Aerial Drone with Vapor Chamber

Figure 1:
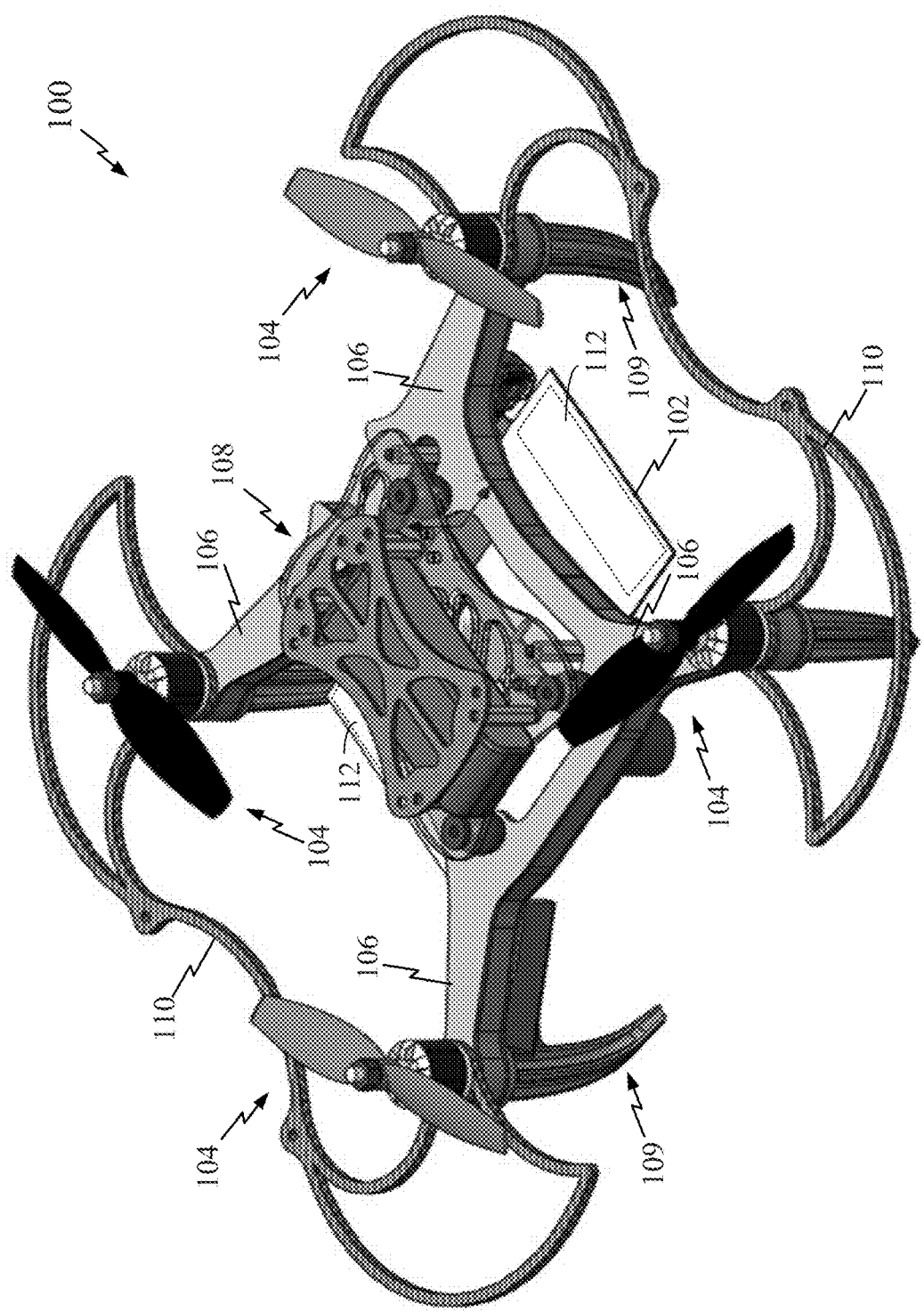
FIG. 1 is a perspective view of an aerial drone with a vapor chamber.
Figure 2:
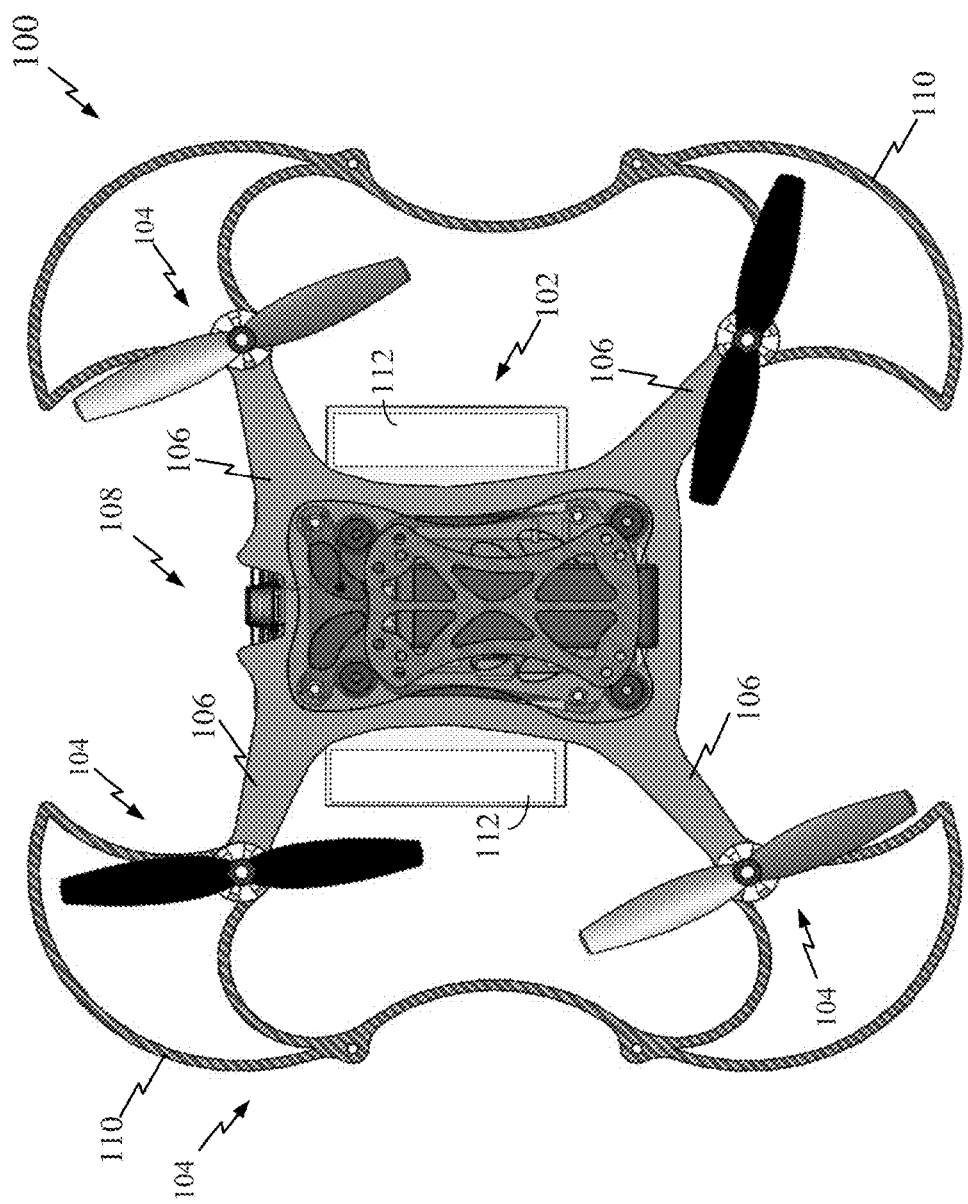
FIG. 2 is a top view of the aerial drone of FIG. 1.

FIG. 1 provides a perspective view of an illustrative aerial drone 100 with a planar vapor chamber 102. FIG. 2 provides a top view of the same drone 100. The aerial drone 100 of FIGS. 1 and 2 is a so-called "quad-rotor" with four rotor systems or propeller systems 104 configured to provide aerodynamic lift. In other examples, more or fewer rotors are provided. In the example of FIGS. 1 and 2, each rotor system 104 is installed at the end of a supporting strut (or "arm") 106 and are controlled by a central control processor (not shown in FIGS. 1 and 2) of the drone via connection lines or wires (also not shown in FIGS. 1 and 2) within the struts 106. The processor is operative to control all or some of the functions and features of the aerial drone and is contained within a central control module 108 of the drone. Note that the illustrations of FIGS. 1 and 2 show the drone without a central housing or covering that may be provided to enclose and protect the central control module 108 and its various components. Note also that FIG. 1 illustrates a set of four legs 109 for supporting the drone while it is not in use.

In the example of FIGS. 1 and 2, the drone includes blade guards or bumpers 110 to protect people from injury or objects from damage should the drone collide with a person or object. The blade guards 110 also protect the blades of the rotor systems 104 from damage. In some examples, the aerial drone may be of a conventional design, other than the vapor chamber 102 and any modifications provided to accommodate/mount the vapor chamber, such as pass-through slots in the central control module housing of the drone (discussed below). As such, most of the features and components of the drone itself will not be described in detail herein. Rather, the descriptions herein will be primarily directed to the configuration and operation of the vapor chamber 102 and its mounting/installation in the drone to facilitate cooling of the processor of the drone.

As shown in FIGS. 1 and 2, the vapor chamber 102 may have flap portions that extend laterally or horizontally away from the central control module 108 of the drone into an airflow region of the drone, i.e. a region outside the central housing where air flows past the drone while in operation. In the example of FIGS. 1 and 2, the vapor chamber 102 is rectangular and opposing perimeter portions 112 (shown in dashed lines) of the vapor chamber 102 extend or project into airflow regions between pairs of opposing struts 106. By extending or protruding into the airflow region, the perimeter portions 112 are cooled via convective cooling by the air flowing past the ends of the chamber (which will be generally cooler than the vapor within the vapor chamber even if the ambient air is fairly hot as in the desert or tropics). In use, heat from the processor (again, not shown) serves to vaporize the working fluid within adjacent portions of the vapor chamber 102 and the vapor expands into the perimeter portions 112 of the camber. Air flowing past the perimeter portions 112 cools the vapor enclosed within the perimeter portions, causing the vapor to condense back to liquid and return to the central region of the vapor chamber 102 where it is again vaporized by the heat of the adjacent processor, thus providing a recirulative cooling system that exploits both convective and phase-change cooling.

Figure 3:
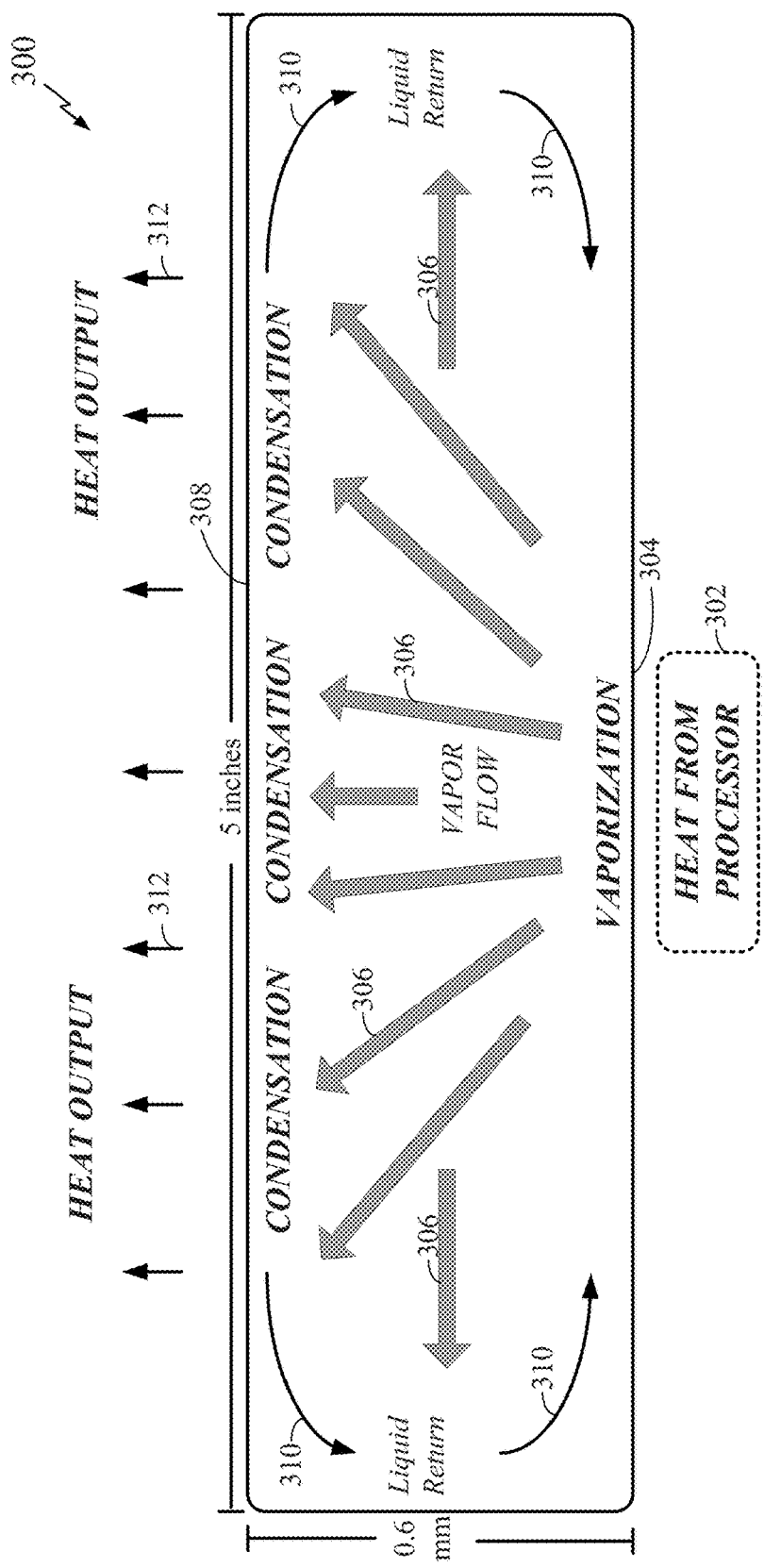
FIG. 3 illustrates the operation of an exemplary planar vapor chamber.

FIG. 3 graphically summarizes the operation of a vapor chamber 300, which is represented in stylized form so as to allow functional features to be described more clearly. In the example of FIG. 3, the vapor chamber is shown in side-view with the vertical dimension (thickness) of the vapor chamber exaggerated and the horizontal dimension compressed. As noted, a vapor chamber for use in a drone may be, e.g., only 0.6 mm (or less) in thickness and yet have at least several inches of length and width. For example, an illustrative vapor chamber may be a 5 inch by 5 inch square with a thickness of 0.6 mm and these particular exemplary dimensions (i.e. 0.6 mm (width) and 5 inches (length)) are shown in the figure. These dimensions are merely exemplary or illustrative.

Briefly, heat 302 from the drone processor (not shown) heats working fluid in an adjacent portion of a lower surface 304 of the vapor chamber 300. The heat is sufficient to convert the working fluid enclosed therein to vapor, i.e. the heat emanating from the processor vaporizes, evaporates or boils the working fluid, resulting in phase-change cooling of the vapor chamber surface near the processor that serves to cool the processor itself. (If the working fluid is water, the vaporization temperature may simply be the boiling point of water. For other working fluids, the vaporization temperature may be higher or lower.) The newly vaporized working fluid expands outwardly within the vapor chamber 300, as shown by vapor flow arrows 306. Some of the vapor moves to the opposite side surface 308 of the vapor chamber (i.e. directly opposite the processor) while other portions of the vapor move to perimeter regions of the vapor chamber (i.e. to the left or right in the figure) that are farther from the processor (and, as already explained, may be positioned outside a central housing of the drone in a surrounding airflow region).

The vapor eventually cools and condenses back to liquid or fluid, which returns to the region of vaporization (as shown by liquid return arrows 310) where it is again vaporized by heat from the processor, thus completing the recirulative cooling cycle. Internal wicking structures or conduits of the vapor chamber are not shown, which may help guide the working vapors and/or fluids within the vapor chamber. Note that condensation along the top surface 308 causes heat to be output (or otherwise emitted or dissipated) from the vapor chamber 300, as represented by heat output arrows 312. In some examples, the entire top portion or surface 308 of the vapor chamber serves as a condensation region. Additionally, in some examples, portions or regions of the lower surface of the vapor chamber may also serve as condensation regions, particularly those portions that are sufficiently far from the processor to be cool enough to permit condensation. Hence, heat may also be output from the lower surface of the vapor chamber, particularly from its perimeter portions that are remote from the processor itself. Still further, note that when mounted within a drone equipped with a powerful processor, relatively little condensation may occur within portions of the vapor chamber 300 that are positioned inside the central housing of the drone as these portions may be relatively warm. A greater amount of condensation will typically occur within portions of the vapor chamber 300 that are positioned outside the central housing and within the airflow region surrounding the drone, as these portions will likely be much cooler.

Thus, FIG. 3 illustrates the phase-change aspects of the overall vapor chamber cooling process via arrows 306 and 310, which serve to spread and dissipate heat from the hot central lower surface of the vapor chamber and hence from the heat source (i.e. the drone processor), thereby cooling the processor. The convective aspects or features of the cooling cycle are represented, e.g., by the heat output 312 from the condensation regions, which serves to convey heat away from the vapor chamber 300 through the surrounding air via convection. The vapor chamber operating principle may be summarized as: an evaporator portion or region of the vapor chamber (i.e. its central or middle bottom portion) is attached, coupled or mounted to the processor to cool the processor by evaporation and boiling (i.e. vaporization). Vapor then moves to a condenser portion or region of the vapor chamber (i.e. its top and/or peripheral portions) where it cools and condenses. The condensate flows back to the center bottom portion of the chamber due to wicking structures and, in some cases, gravity, where it can be vaporized again by the heat from the processor, thus further cooling the processor.

Note that the vapor chambers described herein are different from and distinct from a so-called "heat pipe." Heat pipes are typically very narrow pencil-shaped devices that provide limited cooling since they are essentially one-dimensional devices. The exemplary vapor chambers described herein are planar devices that are instead two-dimensional, i.e. wide and flat, and can provide far more effective cooling due to their greater size and extent. That is, higher heat fluxes typically can be achieved using a planar vapor chamber than a heat pipe (due in part to the much larger heat spreading area of the planar vapor chamber). Still further the vapor chambers described herein are integral devices or components that permit working vapors and/or working fluids to flow freely throughout the interior portions thereof (subject to any wicking due to internal wicking structures). As such, an integral or unitary vapor chamber is different from a set of heat pipes arranged/attached together to form a flat structure. A set of heat pipes attached to form a larger flat combined structure would not allow for fluids to flow from one heat pipe to another and hence would be limited in its cooling capacity due to the essential one-dimensional nature and configuration of the individual heat pipe components. Note also that the vapor chamber of FIG. 3 is just one example of a planar vapor chamber means for cooling. Other suitable planar vapor chamber means for cooling may include other passive "heat spreading" devices, components or apparatus that are generally planar in shape and exploit working fluids that evaporate in one portion of the device and then condense in another portion of the device to provide a recirculating phase-change-based evaporative cooling system.

Exemplary Assembly and Installation Procedures

FIG. 4 summarizes a procedure 400 for assembling an apparatus having a planar vapor chamber 402 and a processor 404 or other processing package (which may include a die package). Since the vapor chamber 402 might be quite large compared to the processor, only the central portion of the vapor chamber 402 is shown in FIG. 4, with peripheral portions truncated in the drawing. Briefly, the processor 404 is mounted to a printed circuit board (PCB) 406. A TIM 408, such as a thermal paste, is applied to the underside of the vapor chamber 402. In one example, the thermal paste is a high-density polysynthetic silver thermal compound, such as those sold under the tradename Artic Silver™. The planar vapor chamber 402 is then attached to a topside or top surface of the processor 404. That is, a first general step includes assembling the vapor chamber 402 and the TIM 408. A second general step includes attaching the processor 404 to the vapor chamber 402 via the TIM 408. Note that, in some examples, the vapor chamber 402 is attached to the processor 404 after the processor/PCB has been installed in the housing of the drone. In other examples, the vapor chamber 402 may be attached to the processor 404 before the resulting combined apparatus 400 is installed in the housing of the drone. Note also that the TIM 408 represents just one example of a mounting means for mounting the vapor chamber to the processor. In other examples, the vapor chamber may be attached to the processor using clamps, brackets, clasps or other devices.

FIG. 5 illustrates an assembled apparatus 500 having the vapor chamber 402 mounted to the topside of the processor 404 via the TIM 408, with the underside of the processor 404 mounted to the PCB 406. Again, only central portions of the vapor chamber 402 are shown in the figure due to its size, with peripheral portions truncated. In addition to the assembled apparatus 500, FIG. 5 illustrates a pair of sidewalls 410 of a central housing of the drone, with portions of the vapor chamber 402 extending through pass-through slots 412 in the sidewalls 410 into airflow regions adjacent the housing. Sealant 414 may be provided between the housing sidewall and the vapor chamber in the pass-through slots 412 to keep out dust and moisture.

FIG. 6 is a flow diagram 600 summarizing aspects of the assembly and use of the vapor chamber/processor package of the drone. Briefly, at 602, the planar vapor chamber and the TIM are assembled. At 604, the planar vapor chamber is attached to processor PCB package via the TIM. At 606, the vapor chamber/processor package is installed in a central housing of the aerial drone, with perimeter portions of the vapor chamber extending through walls of housing into an airflow region surrounding the housing. At 608, the aerial drone is operated or otherwise used, while allowing the vapor chamber to cool the processor via both phase-change cooling (i.e. the vapor chamber cools through evaporative heat spreading) and convective cooling (i.e. airflow passing over the perimeter of the vapor chamber carries additional heat away), as explained above. As noted, in some examples, the vapor chamber is instead attached to the processor after the processor/PCB has been installed in the drone. This may be more convenient in some fabrication or manufacturing implementations.

FIG. 7 is a flow diagram 700 broadly summarizing aspects of the mounting of a vapor chamber/processor package of the aerial drone for the example where the vapor chamber is attached to the processor before the processor is installed in the drone. Briefly, at 702, a planar vapor chamber is mounted to a processor with the vapor chamber configured to dissipate heat from the processor during use of the processor. At 704, the processor and the vapor chamber are installed in an aerial drone, with a portion of the vapor chamber extending into an airflow region of the aerial drone to cool the processor during use of the drone. The vapor chamber may extend into the airflow region of the aerial drone by an amount sufficient to provide convective cooling of a perimeter portion of the vapor chamber during operation of the aerial drone. The vapor chamber may also have legs mounted to extend outwardly from a central portion of the vapor chamber. In examples where the aerial drone has struts that extend from the central portion of the aerial drone to support one or more rotors, the legs of the vapor chamber may be configured or mounted so as to extend outwardly from the central portion along the struts with the legs positioned, depending on the particular implementation, either above, below or within the struts of the drone.

FIG. 8 is a flow diagram 800 broadly summarizing aspects of the assembly and use of the vapor chamber/processor package of the aerial drone for an example where the vapor chamber is attached to the processor after the processor is installed in the drone. Briefly, at 802, a processor is installed within the aerial drone and, at 804, a planar vapor chamber is mounted to the processor of the aerial drone with a portion of the vapor chamber extending into an airflow region of the aerial drone to cool the processor during use of the drone. As with FIG. 7, in some examples the vapor chamber extends into the airflow region of the aerial drone by an amount sufficient to provide convective cooling of a perimeter portion of the vapor chamber during operation of the aerial drone. The vapor chamber may have legs mounted to extend outwardly from a central portion of the vapor chamber. If the aerial drone has struts that extend from the central portion of the aerial drone to support one or more rotors, the legs of the vapor chamber may be configured or mounted so as to extend outwardly from the central portion along the struts.

FIG. 9 is a flow diagram 900 providing further exemplary details of the mounting of a planar vapor chamber and a processor package in the aerial drone and its subsequent use. At 902, a vapor chamber is provided that is configured to cool a processor via phase-change and evaporative cooling/heat spreading. In some examples, the vapor chamber is planar and has a thickness of between 0.4 mm and 0.6 mm. At 904, a processor is provided to control the aerial drone, including controlling components of the drone such as a video device, a camera device, a navigation device and/or a wireless communication device. At 906, the vapor chamber is mounted to the processor using a TIM such as a thermal paste, with a perimeter portion of the vapor chamber extending from the processor and with the processor mounted to a PCB. At 908, the vapor chamber and the processor/PCB are installed in a sealable central housing of the aerial drone with the perimeter portion of the vapor chamber extending through the housing from the processor into an airflow region of the aerial drone by an amount sufficient to provide convective cooling of the perimeter portion of the vapor chamber during operation of the aerial drone. At 910, the aerial drone is operated while the vapor chamber cools the processor package via both phase-change cooling/heat spreading (that draws heat from the processor to the top surface and/or perimeter portions of the vapor chamber) and convective cooling that draws heat away from the perimeter portion of the vapor chamber into the surrounding air to dissipate the heat.

Further Exemplary Aerial Drones and Components

FIG. 10 is a block diagram illustrating various components of an aerial drone 1000. In this example, the drone includes an aerial drone main processor 1002 and a planar vapor chamber 1004, which may be mounted/installed in the drone as already discussed. The processor 1002 includes a rotor controller 1006 for controlling one or more sets of rotors 1008. The processor 1002 in this example also includes: a video camera controller 1010 for controlling a video camera (not shown); a still camera controller 1012 for controlling a still camera (not shown) such as a digital camera equipped for single-image photography rather than video photography: a navigation controller 1014 for controlling a navigation device such as a global positioning system (GPS) device (not shown) equipped to track the location of the drone; a wireless communications controller 1016 for controlling a wireless communication device such as a cellular or radio communication device (not shown) equipped to receive commands from a user or operator; and a temperature monitor/controller 1018 for controlling a temperature monitor (not shown) to assess the temperature of the processor or other components of the aerial drone. These are exemplary components and, in other drones, more or fewer components may be provided. Multiple processors may be employed in some examples.

FIG. 11 is a top view of an aerial drone 1100 with a turtle-shaped vapor chamber 1102, i.e. a planar vapor chamber that has legs or arms 1112 configured to extend along (and in this example under) the struts 1106 of the drone, thus having a shape resembling a stylized turtle. In FIG. 11, portions of the vapor chamber 1102 are shown in dashed lines since the vapor chamber in this particular example is installed beneath the main body of the drone and would otherwise be obscured in this top view. The vapor chamber 1102 may be regarded as having a rectangular center portion with the legs 1112 projecting or extending outwardly from that rectangular central portion. In other examples, the center portion of the vapor chamber 1102 may have other shapes, such as square, oval or round. The legs 1112 in this example are rectilinear with sharp edges but in other examples may have curved or rounded edges. Other exemplary chamber shapes are shown in FIGS. 12-15, discussed below. Although the planar vapor chambers of FIGS. 11-15 may have differing shapes, the vapor chambers are nevertheless each formed as a single integral vapor chamber, rather as a set of separate vapor chambers attached to one another. That is, the vapor chamber 1102 is formed to have legs or arms as portions of a unitary chamber, rather merely having discrete legs or arms attached to a separate central chamber. This allows vapors and fluids within the vapor chamber 1102 to flow freely throughout the entire chamber to facilitate overall cooling efficacy. Although FIG. 11 illustrates an example where the vapor chamber is positioned below the drone struts, the vapor chamber extensions (i.e. its legs or arms 1112) may be positioned below the drone frame, above the drone frame or, in some examples, within the struts of the drone frame.

By providing legs 1112 that extend the vapor chamber along the struts 1106, the overall size of the vapor chamber 1102 may be made larger than might otherwise be accommodated in a given drone design, without unduly affecting or hindering the aerodynamics of the drone. That is, by extending the vapor chamber 1102 along (and under) the struts of the drone, the airflow below the rotors 1104 is not unduly effected. However, the legs 1112 of the vapor chamber nevertheless benefit from the considerable convective cooling that arises from the (typically intense) airflow passing by the struts. Hence, not only does the vapor chamber 1102 benefit from its generally larger size but the legs 1112 of the vapor chamber benefit from enhanced convective cooling by virtue of their position near the struts, all without unduly affecting the overall aerodynamics of the drone. Otherwise routine airflow modelling may be used to determine preferred or optimal shapes for the vapor chamber and its legs, as well as for the struts of the drone. In this regard, in some examples, the size, shape and/or placement of the struts (and/or other components of the drone) may be designed or specified in conjunction with the vapor chamber 1102 to optimize overall cooling while maintaining proper aerodynamics. Note that FIG. 11 also identifies other selected components of the drone such as its central control module 1108 and its blade guards 1110. However, other features and components of the drone will not be described in detail herein, as they may be otherwise conventional.

FIG. 12 is a top view of an aerial drone 1200 having a turtle-shaped vapor chamber 1202 with legs 1212 that more closely match the shape of the struts 1206 of the drone. In this example, the vapor chamber legs 1212 are positioned above the struts and hence are shown in solid lines. In other examples, the vapor chamber 1200 may be positioned with its legs 1212 below or within the struts. In any case, the legs 1212 of the vapor chamber 1202 are sized and configured so as to be mounted entirely or completely above (below or within) corresponding struts 1206 of the drone with no portion of the legs 1212 extending laterally (i.e. horizontally) beyond the edges of corresponding or respective struts 1206 (at least when viewed from above). By providing vapor chamber legs 1212 that lie completely above (or below or within) the struts 1206 of the drone, drone aerodynamics may be substantially unaffected by the presence of the legs (although the overall size of the vapor chamber 1202 is not as large as in the example of FIG. 11 and hence overall cooling might not be as effective as in FIG. 11). Still, the legs 1206 of the vapor chamber of FIG. 12 nevertheless benefit from the considerable convective cooling that arises from the airflow passing the struts 1206. Again, otherwise routine airflow modelling may be used to determine preferred or optimal shapes for the vapor chamber and its legs, as well as for the struts of the drone. As with the vapor chamber of FIG. 11, the vapor chamber of FIG. 12 may be regarded as having a rectangular center but the center portion may have other shapes, such as square, oval or round. The legs 1212 are rectilinear with sharp edges but may have curved or rounded edges in other examples. As with FIG. 11, FIG. 12 identifies selected components of the drone such as the central control module 1208 and the blade guards 1210 but other features and components of the drone are not specifically identified or described herein.

FIG. 13 is a top view of an aerial drone 1300 having a turtle-shaped vapor chamber 1302 with legs 1312 that are considerably smaller than the struts 1306 of the drone and, in this example, are mounted within the struts. That is, in the example of FIG. 13, the legs 1312 of the vapor chamber 1302 are sized and configured to be smaller than corresponding struts 1306 of the drone and are mounted within the struts. Openings may be provided in the struts to permit air to flow past the legs to facilitate cooling. By providing vapor chamber legs 1312 that are considerably smaller than the struts 1306 of the drone (and positioned within the struts), drone aerodynamics is even less affected by the presence of the legs than in the foregoing examples. Still, the legs 1306 of the vapor chamber benefit from convective cooling that arises from airflow passing through openings within the struts 1306. The legs 1312 are again rectilinear with sharp edges but may instead have curved or rounded edges. FIG. 13 identifies selected components of the drone such as central control module 1308 and blade guards 1310 but other components of the drone are not described in detail herein. In other examples, the legs 1312 may be mounted above or below the struts.

FIG. 14 is a top view of an aerial drone 1400 having a turtle-shaped vapor chamber 1402 with curved legs 1412 that are wider than the struts 1406 of the drone. (Portions of the vapor chamber 1402 that are beneath the drone are again shown in dashed lines. In other examples, the legs 1412 may be positioned above or within the struts.) The legs 1412 are curvilinear with smooth or rounded edges. By providing vapor chamber legs 1412 that are curved, drone aerodynamics may be less affected by the presence of the legs than in some of the foregoing examples, such as the example of FIG. 11. Still, the wide legs 1406 of the vapor chamber of FIG. 14 provide considerable convective cooling due to airflow passing the struts 1406. FIG. 14 identifies other selected components such as central control module 1408 and blade guards 1410 but other components are not described in detail or specifically identified.

FIG. 15 is a top view of an aerial drone 1500 having a turtle-shaped vapor chamber 1502 with curved legs 1512 that are smaller than the struts 1506 of the drone. The entire vapor chamber 1502 is shown in dashed lines as it is located entirely beneath the drone. That is, in the example of FIG. 15, the curved legs 1512 of the vapor chamber 1502 are sized and configured to be smaller than corresponding struts 1506 of the drone. The legs 1512 are curvilinear with smooth or rounded edges. By providing vapor chamber legs 1512 that are curved, drone aerodynamics may be even less affected by the presence of the legs than in the example of FIG. 15. Still, the legs 1506 of the vapor chamber 1502 benefit from convective cooling that arises from airflow passing the struts 1506. FIG. 15 identifies other selected components such as central control module 1508 and blade guards 1510 but other components are not described or specifically identified.

Exemplary Electronic Devices for Use in Communication with the Drone

FIG. 16 illustrates various electronic devices that may be used in communication with any of the aforementioned aerial drones for controlling the drones and/or receiving signals therefrom. For example, a mobile telephone 1602, a laptop computer 1604 and a fixed location terminal 1606 may be equipped to control and/or receive signals from a drone 1600. The devices 1602, 1604, 1606 illustrated in FIG. 16 are merely exemplary. Other electronic devices that may also be used in communication with the aerial drone include, but are not limited to, drone remote controllers, mobile devices, hand-held personal communication systems (PCS) units, portable data units such as personal digital assistants, GPS enabled devices, navigation devices, set top boxes, video players, entertainment units, fixed location data units such as meter reading equipment, communications devices, smartphones, tablet computers, virtual reality (VR) headsets or any other device that stores or retrieves data or computer instructions, or any combinations thereof.

Computer Modelling Results for Exemplary Drones

FIG. 17 provides a comparison of computer-modelled temperature results for a drone 1700 without a vapor chamber (i.e. a non-thermally enhanced drone) and a drone 1702 having a rectangular planar vapor chamber of the type illustrated in FIGS. 1 and 2. Note that FIG. 17 does not show the vapor chamber itself so as not to obscure the internal components. In addition, the figures show only a portion of the interior housing of the drones, particularly processors 1704 and 1706 and surrounding PCB components. As many of the internal components may be otherwise conventional, only selected components and features are identified and discussed. Computer temperature modelling shows that the processor 1704 of the drone 1700 without a vapor chamber reaches an operating temperature of about 86 C.°. Note that substantial surrounding portions of the PCB also reach relatively high temperatures as indicated, for example, by the large light-colored region 1708. In contrast, computer temperature modelling shows that the processor 1706 of the vapor chamber-cooled drone 1702 only reaches an operating temperature of about 61.3 C.°. Note also that the surrounding portions of the PCB of drone 1702 are also significantly cooler as indicated, for example, by the much smaller light-colored region 1710.

One or more of the components, steps, features, and/or functions illustrated in FIGS. 1, 2, 3, 4, 5, 6, 7, 8, 9, 10, 11, 12, 13, 14, 15, 16 and/or 17 may be rearranged and/or combined into a single component, step, feature or function or embodied in several components, steps, or functions. Additional elements, components, steps, and/or functions may also be added without departing from the invention. One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described in the figures. Any novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. The term "die package" is used to refer to an integrated circuit wafer that has been encapsulated or packaged or encapsulated.

In addition, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged, where appropriate. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An aerial drone, comprising:
    two or more rotors;
    an airflow region of the aerial drone;
    a processor operative to control the aerial drone; and
    a planar vapor chamber including a first portion mounted to the processor and located within sidewalls of a central housing, and a second portion extending from the first portion through the sidewalls of the central housing and protruding from the sidewalls of the central housing into the airflow region of the aerial drone, the airflow region directly located between the two or more rotors.

2. The aerial drone of claim 1, wherein the second portion of the planar vapor chamber extends into the airflow region by an amount sufficient to provide convective cooling of the second portion of the planar vapor chamber during operation of the aerial drone.

3. The aerial drone of claim 1, wherein the processor is mounted within the central housing of the aerial drone and the second portion of the planar vapor chamber extends through pass-through slots in the sidewalls of the central housing into the airflow region of the aerial drone, the airflow region of the aerial drone surrounding the housing.

4. The aerial drone of claim 1, wherein the planar vapor chamber is mounted to the processor using a thermal interface material (TIM).

5. The aerial drone of claim 1, wherein the planar vapor chamber is an integral device configured to permit a working fluid to flow throughout interior portions thereof.

6. The aerial drone of claim 1, wherein a first side of the processor is mounted to a printed circuit board and a second side of the processor is mounted to the planar vapor chamber.

7. The aerial drone of claim 1, wherein the planar vapor chamber is shaped with legs extending outwardly from a central portion of the planar vapor chamber.

8. The aerial drone of claim 7, wherein the aerial drone has struts that extend from a central portion of the aerial drone to support the one or more rotors and wherein the legs of the planar vapor chamber extend outwardly from the central portion along the struts.

9. The aerial drone of claim 8, wherein the legs of the planar vapor chamber are positioned relative to the struts to not interfere with aerodynamics of the aerial drone.

10. The aerial drone of claim 8, wherein the legs extend along the struts either above, below or within the struts.

11. The aerial drone of claim 1, further comprising an on-board electronic system including a video device, a camera device, a navigation device and/or a wireless communication device, and wherein the processor controls the electronic system.

12. The aerial drone of claim 1, wherein the first portion and the second portion of the planar vapor chamber are on the same plane.

13. A method for providing a cooling apparatus for an aerial drone, comprising:
    mounting a planar vapor chamber to a processor with the planar vapor chamber configured to dissipate heat from the processor during use of the processor; and
    installing the processor and a first portion of the planar vapor chamber within sidewalls of a central housing of the aerial drone, a perimeter portion of the planar vapor chamber extending from the first portion through the sidewalls of the central housing and protruding from the sidewalls of the central housing into an airflow region located between a pair of struts of the aerial drone to cool the processor during use of the aerial drone.

14. The method of claim 13, wherein the planar vapor chamber extends into the airflow region of the aerial drone by an amount sufficient to provide convective cooling of a perimeter portion of the planar vapor chamber during operation of the aerial drone.

15. The method of claim 14, wherein the planar vapor chamber has legs extending outwardly from a central portion of the planar vapor chamber.

16. A method for providing a cooling apparatus for an aerial drone, comprising:
    installing a processor within the aerial drone; and
    mounting a first portion of a planar vapor chamber to the processor of the aerial drone, the first portion and the processor located within sidewalls of a central housing, a perimeter portion of the planar vapor chamber extending from the first portion through the sidewalls of the central housing and protruding from the sidewalls of the central housing into an airflow region of the aerial drone to cool the processor during use of the drone, wherein the first portion and the perimeter portion of the planar vapor chamber are on the same plane.

17. The method of claim 16, wherein the perimeter portion of the planar vapor chamber extends into the airflow region of the aerial drone by an amount sufficient to provide convective cooling of the perimeter portion of the vapor chamber during operation of the aerial drone.

18. The method of claim 17, wherein the planar vapor chamber has legs extending outwardly from the first portion of the planar vapor chamber.

* * * * *